Nov. 28, 1967 C. W. SMITH 3,355,078

APPARATUS FOR ASSEMBLING ELECTRICAL COMPONENTS

Filed Nov. 23, 1964

INVENTOR
CHARLES W. SMITH

United States Patent Office 3,355,078 Patented Nov. 28, 1967

3,355,078
APPARATUS FOR ASSEMBLING ELECTRICAL COMPONENTS

Charles W. Smith, Canoga Park, Calif., assignor to The Bunker-Ramo Corporation, Stamford, Conn., a corporation of Delaware Filed Nov. 23, 1964, Ser. No. 413,024
20 Claims. (Cl. 228—44)

This invention relates to apparatus for assembling electrical components, and, more particularly, to such apparatus embodying a novel template for accurately holding a plurality of components in position while they are being electrically connected into a circuit carried by a supporting plate.

The present trend in the electronics art is to provide smaller and smaller circuits and components. That trend has now reached the point where a thin-film circuit carried by a supporting plate two inches square or less may require the connection thereto of several dozen components. Thus far, such connections have had to be laboriously made by hand in an exceedingly time-consuming delicate operation. In addition, because of the exceedingly small size of the components and the conductors to which they are to be connected, many errors have resulted that have led in some cases to destruction of the circuitry, or, at best, to expensive rework. Thus, the cost of such circuitry is quite high.

Therefore, it is a primary object of the present invention to provide apparatus for accurately holding a plurality of components in position while they are being electrically connected into a thin-film or printed circuit carried by a supporting plate.

Another object of the invention is to provide apparatus, which not only accurately positions components, but also positions their electrical leads, to minimize errors when the leads are connected into a thin-film or printed circuit.

A further object is to provide electrical component assembly apparatus which embodies means for reducing the danger of destruction of the component by heat while it is being soldered into a circuit.

The foregoing objectives are attained in accordance with the invention by providing apparatus, including a template, for positioning and holding both a plurality of electrical components and their leads while they are being connected into a circuit. The template is provided with a plurality of accurately located depressions, one for holding each of the components, and with a plurality of channels for holding the component leads. Vacuum means may be provided for retaining the components in position in the depressions.

The template also contains a plurality of openings therethrough aligned with the channels which position the component leads to permit solder to be introduced through the template to solder the leads into the circuit. In addition, in one embodiment of the invention, means are provided for introducing an inert or reducing gas around the component during the soldering operation to act as a coolant for the component and to prevent oxidation of the component leads and the circuit into which they are being connected.

The invention, together with further objects and advantages thereof, will be better understood from the following description taken in conjunction with the accompany-the drawings, in which.

Figures 1, 2, 3, 4, 5, 6:
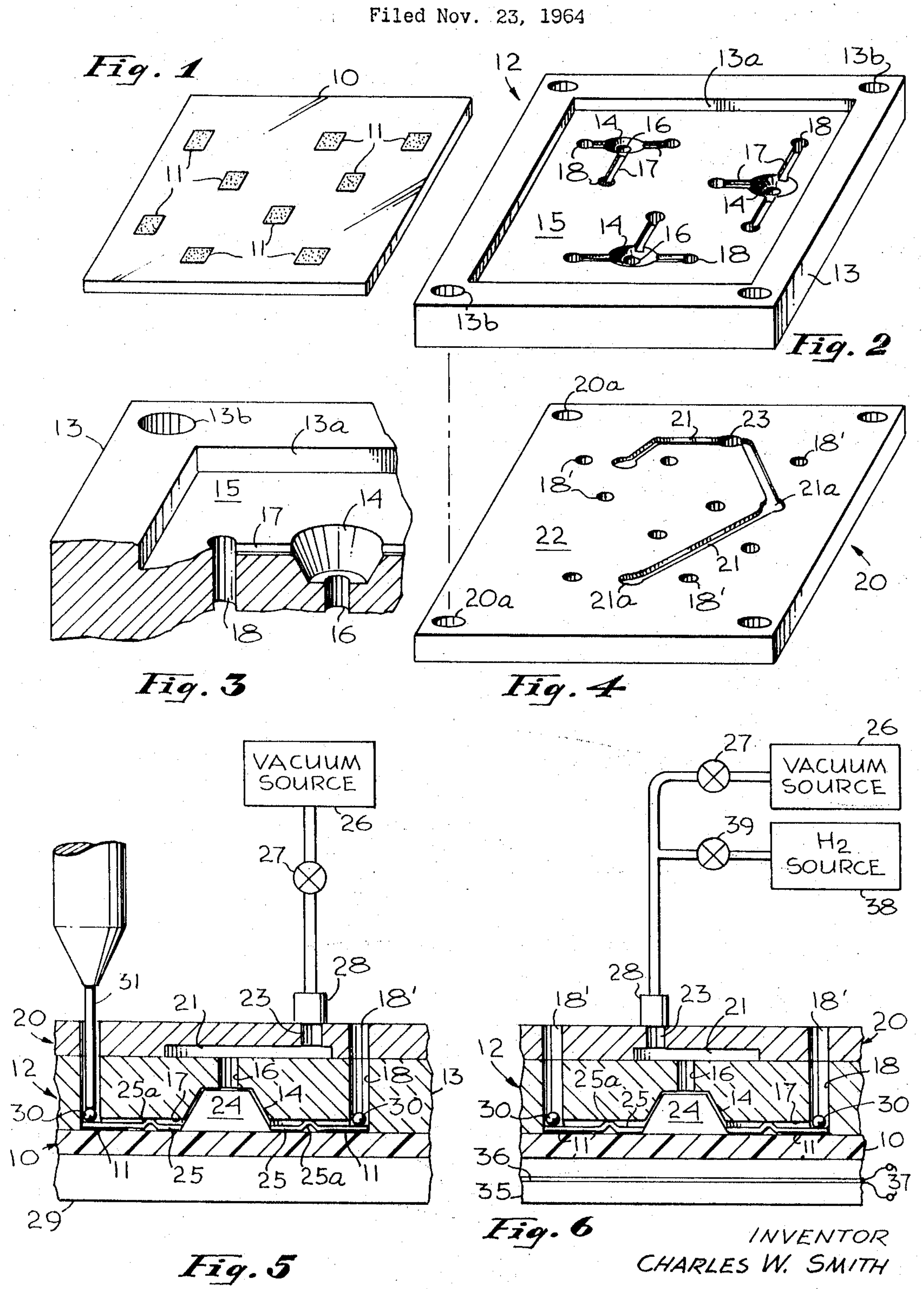
FIGURE 1 is a diagrammatic perspective view of a supporting plate carrying conductors to which it is desired to connect components.
FIGURE 2 is a perspective view of a template embodied in the apparatus of the invention for securing components to the conductors shown in FIGURE 1.
FIGURE 3 is a fragmentary perspective view, partially in section, of a portion of the template shown in FIGURE 2.
FIGURE 4 is a perspective view of a plate for attachment to the template shown in FIGURES 2 and 3 for applying a vacuum to the template.
FIGURES 5 and 6 are diagrammatic sectional views illustrating the operation of the apparatus of the invention.

As previously noted, the invention provides apparatus for assembling a plurality of electrical components on a circuit carried by a supporting plate. FIGURE 1 is a very simplified diagrammatic view of a supporting plate 10 carrying a plurality of conductors 11 to which it is desired to attach components. It is understood that in actual practice a supporting plate 10 would in all probability carry many more conductors than are illustrated. Also, various ones of the conductors 11 might be interconnected by means of resistors and/or capacitors which form an integral network to which prefabricated components such as transistors and the like are to be connected. However, inasmuch as the supporting plate and circuit carried thereby per se form no part of the present invention, the circuit details have not been illustrated. A typical thin-film circuit to which components may be connected using the apparatus of the present invention, and a method of making such a circuit, are described in an article entitled "Photo-Etching Thin-Film Circuits" by C. W. Skaggs, which appeared in the June 15, 1964 issue of "Electronics," pages 94–98.

FIGURES 2 and 3 illustrate a template which is embodied in the apparatus of the invention for assembling components on the circuit shown in FIGURE 1. The template, indicated generally by the numeral 12, comprises a plate 13, which may conveniently be made of aluminum or other easily machinable, good heat-conducting material. The plate 13 is recessed as at **13*a* to the exact dimensions of the supporting plate 10 shown in FIGURE 1. The recess in the plate 13 provides means for receiving the supporting plate with the conductors 11** thereon turned face downwardly into the recess. The recess may be formed by conventional means such as milling or other convenient means.

The plate 13 is provided with a plurality of depressions 14 formed in its recessed surface 15, each depression 14 being accurately positioned to hold a component (not shown) whose leads are to be connected to the conductors 11. The template is provided with means other than the depressions 14 for maintaining components and their leads accurately positioned. For example, there is an aperture 16 through the plate 13 at the position of each of the depressions 14. Each of the apertures 16 may be connected to a vacuum source, as will be hereinafter described, to cause the components to be securely held in the depressions 14. In addition, each of the depressions 14 has a plurality of channels 17 radiating therefrom and positioned to receive the leads of the component positioned in the depression 14. The channels 17 may be milled or otherwise conventionally formed in the recessed surface 15 and are of suitable size and length to receive the component leads. The outer end of each of the channels 17 connects with an aperture 18 extending through the plate 13, the aperture 18 providing means for connecting the leads lying in the channels 17 to the conductors 11 on the supporting plate 10.

The locations of the depressions 14, apertures or holes 16 and 18, and channels 17, may be accurately determined by any one of several means. For example, if the conductors 11 have been produced on the supporting plate 10 by the method described in the aforementioned article by C. W. Skaggs, the photographic negative of the conductor pattern used in that process may be again used in making the template 12. As described in the article, a photographic negative is made of the conductor pattern to be formed on the supporting plate 12. Such a negative may be used in making the template 12 by coating the surface 15 with a photo-resist and then exposing it through the conductor negative. After development, the unexposed photo-resist may be removed and the exposed photo-resist dyed to clearly define the conductor pattern on the surface 15. The holes 18 may be drilled through the conductor pattern and the plate 13, and the holes 16 drilled at appropriate positions to locate the centers of the depressions 14. The photo-resist may then be removed from the surface 15 and the depressions 14 formed by suitably contouring the plate 13 about the holes 16 as centers. Of course, the shapes and depths of the depressions 14 will vary for various types and sizes of components and each depression must be accurately formed for the component that it is to receive. After the depressions 14 have been formed, the channels 17 may be formed as by milling to connect the depressions 14 with the holes 18.

If a photographic negative of the conductor pattern of the circuit is not available, an enlarged drawing may be made of the circuit with the positions of the holes 16 and 18 accurately shown thereon. A photographic negative in the actual size of the circuit may then be made from the drawing and used in exposing a photo-resist coated on the recessed surface 15, as previously described. It is contemplated that other methods may be used to locate the positions of the holes and depressions in the template 12 and the invention is in no way limited to any particular method.

One of the advantages of the present invention is that the holes 16 in the template may be utilized, if desired, as means through which a vacuum may be applied to hold components firmly in the depressions 14. In the event that a vacuum is to be used, another member is secured to the back of the plate 13 by means of bolts or the like extending through holes 13*b* in the corners of the plate 13. Such a member is shown in FIGURE 4 as a plate 20.

The plate 20 provides means for applying a vacuum to each of the holes 16 in the template 12, such means comprising a circuitous channel 21 milled or otherwise formed in its surface 22. The channel 21 is so formed that, when the plates 13 and 20 are secured together by bolts or the like extending through holes 13*b* in the plate 13 and through holes 20*a* in the plate 20, the holes 16 in the plate 13 are all interconnected by means of the channel 21. The channel 21 is intersected at some point by an aperture or hole 23 extending through the plate 20 and provided on the unseen side of the plate 20 with a suitable fitting for connection to a vacuum source (shown in FIGURES 5 and 6). The channel 21 is so formed that it does not lie across any of the holes 18 in the plate 12. Although it would probably not be so in actual practice, for purposes of illustration the channel 21 is shown as having enlarged areas 21*a* corresponding to the positions of the holes 16 when the plates 13 and 20 are secured together. Thus, when the plates 13 and 20 are secured together and the opening 23 and the plate 20 connected to a suitable vacuum source, a vacuum is provided through each of the holes 16 in the plate 13. It is pointed out that when the holes 18 are initially drilled in the plate 13 the plate 20 should be secured thereto so that holes 18', corresponding to the holes 18, are formed in the plate 20. Thus, means are provided by the holes 18' through the plate 20, as well as by the holes 18 through the plate 13, to connect the component leads to the conductors on the supporting plate placed in the recess in the template 12.

FIGURE 5 shows the apparatus of the invention in use to connect a component such as a transistor 24 to the conductors 11 by means of leads 25. The component 24 is maintained in position in the recess 14 by means of a vacuum applied from a vacuum source 26. The vacuum source 26 is connected through a valve 27 and through a suitable fitting 28 secured to the plate 20 to connect with the aperture 23 in the plate 20.

The component leads 25 held in the channels 17 of the template may be crimped as at 25*a*, so that the plate 13 effectively sinks heat from the leads themselves during the attachment operation. In addition, the crimps 25*a* provide relief from stresses on the component and on the bond. The supporting plate 10 is mounted on a base 29. The electrical connections between the component leads 25 and the conductors 11 may be made by dropping solder balls 30 through the openings 18 and 18' in the plates 13 and 20, respectively, and inserting a heated probe 31 into the holes to melt the solder and complete the electrical connection.

FIGURE 6 illustrates a method of using a modification of the apparatus of the invention. The apparatus shown in FIGURE 6 differs from that shown in FIGURE 5 in that the supporting plate 10 is mounted on a heated base plate 35 so that the supporting plate 10 and the conductors 11 carried thereon attain the temperature of the heated base plate 35. Heating of the base plate may be accomplished in any conventional manner, such as by means of an insulated electrical resistance heater sandwiched between portions of the base plate as shown at 36. Electrical leads for the resistance heater are indicated by the numeral 37. The apparatus shown in FIGURE 6 also includes a source 38 of hydrogen or an inert gas connected to the fitting 28 through a valve 39.

In using the apparatus shown in FIGURE 6, the base plate 35 and the supporting plate 10 mounted thereon are first heated to a temperature of approximately 250° C. After the template 12 is placed in position over the supporting plate 10 and conductors 11, and the supporting plate and conductors have reached the desired temperature, the vacuum source 26 may be turned off by means of the valve 27. Solder balls 30 are then dropped through the holes 18 and 18' and the hydrogen gas source 38 is turned on by means of the valve 39. Heat from the base plate 35 melts the solder and forms an electrical connection between the leads 25 and the conductors 11. The hydrogen gas which is forced through the vacuum holes 16 serves a dual purpose. First, it acts as a coolant to keep the component 24 from being heated to a dangerous degree and, second, it serves to inhibit oxidation of the component leads 25 and the conductors 11.

It is now apparent that the apparatus of the invention attains the stated objective. It accurately holds a plurality of components in position, as well as positions their electrical leads, while the leads are being connected into a thin-film or printed circuit, and it provides a heat sink to prevent the component being connected from becoming overheated while the connection is being made. Although two embodiments of the invention have been shown and described, it is apparent that many changes and modifications thereto may be made by one skilled in the art without departing from the true spirit and scope of the invention.

What is claimed is:

1. Apparatus for assembling electrical components having leads extending outwardly from a body portion on a supporting plate and having conductors carried thereon, comprising:

a template having depressions therein for retaining said components in positions for their leads to be registered with and connected to said conductors and having an aperture therethrough at the position of each of said depressions, and means for connecting said apertures to vacuum source means for maintaining said components in said depressions, said template having means for receiving said supporting plate to align said conductors with said leads, said template having additional apertures therethrough aligned with each of said leads to permit connecting said leads to said conductors.

2. The apparatus defined by claim 1, wherein said template has means for maintaining said leads aligned with said additional apertures.

3. Apparatus for assembling electrical components having outwardly extending leads to form a circuit with conductors carried by a supporting plate, comprising:

a template having depressions therein for retaining said components in positions for their leads to be connected to said conductors and having an aperture therethrough at the position of each of said depressions, said template having means for receiving said supporting plate to align said conductors with said leads, and means connecting said apertures to hydrogen gas source means, said template having means for receiving said supporting plate to align said conductors with said leads, and means detachably engaging with said supporting plate for heating said conductors.

4. The apparatus defined by claim 3, wherein said template has additional apertures therethrough aligned with each of said leads to permit connecting said leads to said conductors.

5. The apparatus defined by claim 4, wherein said template has means for maintaining said leads aligned with said additional apertures.

6. Apparatus for assembling electrical components having leads outwardly extending from a body portion onto a supporting plate and having conductors carried thereon so as to form an electrical circuit comprising:

a template having depressions therein for retaining said components in positions for their leads to be registered with and connected to said conductors and having an aperture therethrough at the position of each of said depressions, and means for connecting said apertures to vacuum source means for maintaining said components in said depressions and to hydrogen gas source means, said template having additional apertures therethrough aligned with each of said leads to permit connecting said leads to said conductors.

7. The apparatus defined by claim 6, further including means detachably engageable with said supporting plate for heating said conductors.

8. The apparatus defined by claim 6, wherein said template has channels for maintaining said leads in position.

9. A template for assembling electrical components having outwardly extending leads to form a circuit carried by a supporting plate and having conductors, said template having depressions therein for temporarily retaining said components in positions for their leads to be registered with and connected to said conductors, said template having a recess cooperating with said supporting plate for releasably receiving said supporting plate so as to align said conductors with said leads, said template having apertures extending between one side of said template and said recess and being aligned with each of said leads to permit connecting said leads to said conductors, and said template having channels interconnecting said depressions with said apertures for maintaining said leads in position.

10. The invention as defined in claim 9 including means detachably engaging with said supporting plate for heating said conductors to effect mechanical securement between said leads and said conductors.

11. The invention as defined in claim 10 wherein said supporting plate is composed of heat insulating material and said template is composed of thermal conductive material so that said template is an effective heat sink while said conductors are being heated.

12. The invention as defined in claim 9 wherein each of said leads includes a crimped deformation formed midway along its length between the opposite ends thereof for providing stress relief.

13. Apparatus for assembling electrical components having leads extending outwardly from a body portion onto a supporting plate having conductors carried on one surface thereof, comprising:

a template having open depressions for temporarily retaining the component body portions in positions to be disposed adjacent selected ones of the conductors, said template having channels formed therein on the same side of said template as said open depressions and communicating with said depressions for maintaining the leads in position to be registered with and connected to the conductors; and means operatively coupled to the supporting plate for heating the conductors sufficiently to effect connection between the leads and the conductors;

said template being operable to provide a heat sink to prevent the component being connected from becoming overheated while the connection is being made.

14. The invention as defined in claim 13 wherein said template depressions have a predetermined depth sufficient to removably seat the entire body portion of each component therein so that the peripheral surface of the body portion is substantially flush with the opening to said respective depressions.

15. The invention as defined in claim 14 wherein said template includes means for releasably receiving the supporting plate so as to align the conductors with the leads.

16. Apparatus for assembling electrical components having leads extending outwardly from a body portion thereof onto a supporting plate having conductors carried on one surface thereof, comprising:

a template composed of thermally conductive material having open depressions for temporarily retaining component body portions in positions to be disposed adjacent selected ones of the conductors, said template having channels formed therein on the same side of said template as said open depressions and communicating with said depressions for engagingly accepting and releasably maintaining the leads in heat conducting relation to said template with the extended free ends of the leads in registration with and for connection to the conductors, whereby the component being connected is prevented from becoming overheated while the connection is being made; and means operatively coupled to the supporting plate for heating the conductors sufficiently to effect connection between the extended free ends of the leads and the conductors.

17. Apparatus for assembling electrical components having leads extending outwardly from a body portion thereof onto a supporting plate having conductors carried on one surface thereof, comprising:

a template composed of thermally conductive material having open depressions for temporarily retaining component body portions in positions to be disposed adjacent selected ones of the conductors, said template having channels formed therein on the same side of said template as said open depressions and communicating with said depressions for engagingly accepting and releasably maintaining each of the extended free ends of the leads in a particular position and in registration with and for connection to respective ones of the conductors, each of said particular positions being disposed from the body portion of each component a prescribed distance substantially equal to each respective length of the lead; and means operatively coupled to the supporting plate for heating the conductors sufficiently to effect connection between the extended free ends of the leads and the conductors;

a portion of said template disposed in thermal conducting relationship between said particular lead free end positions and the body portion of each component effective to prevent the component being connected from becoming overheated while the connection is being made.

18. Apparatus for assembling electrical components having leads extending outwardly from a body portion thereof onto a supporting plate having conductors carried on one surface thereof, comprising:

a template composed of thermally conductive material having open depressions for temporarily retaining component body portions in positions to be disposed adjacent selected ones of the conductors, said template having channels formed therein on the same side of said template as said open depressions and communicating with said depressions for engagingly accepting and releasably maintaining the leads in heat conducting relation to said template, with the extended free ends of the leads in registration with and for connection to the conductors.

19. Apparatus for assembling electrical components on a supporting plate, said components being susceptible to damage from overheating when subjected to temperature above a predetermined critical limit, said components having leads extending outwardly from a body portion thereof, the leads being adapted to connect through the application of heat thereto with conductors carried on the supporting plate, comprising:

a template composed of thermally conductive material having open depressions for temporarily retaining component body portions in positions to be disposed adjacent selected ones of the conductors, said template having channels formed therein on the same side of said template as said open depressions and communicating with said depressions for engagingly accepting and releasably maintaining the leads in heat conducting relation to said template, with the extended free ends of the leads in registration with and for connection to the conductors so that the component being connected is prevented from being subjected to a temperature above the predetermined critical limit while the connection is being made.

20. The invention as defined in claim 19 wherein the components are held in position by the engagement of the supporting plate and said template with opposite sides of the leads whereby the component body portion is free from engagement with said template and is carried on the supporting plate.

References Cited

UNITED STATES PATENTS

| | | | |
|---|---|---|---|
| 1,181,741 | 5/1916 | Coolidge | 29—494 |
| 2,981,868 | 4/1961 | Severson | 29—155.5 |
| 2,985,948 | 5/1961 | Peters | 29—155.5 |
| 3,011,254 | 12/1961 | Melill et al. | 29—494 |
| 3,068,824 | 12/1962 | Stalker | 228—42 |
| 3,084,391 | 4/1963 | Parstorfer | 29—155.5 |
| 3,108,364 | 10/1963 | Winn | 29—155.5 |

RICHARD H. EANES, Jr., *Primary Examiner.*

CHARLIE T. MOON, *Examiner.*

M. L. FAIGUS, *Assistant Examiner.*